(12) United States Patent
Nowell et al.

(10) Patent No.: US 11,705,193 B2
(45) Date of Patent: Jul. 18, 2023

(54) ERROR AVOIDANCE BASED ON VOLTAGE DISTRIBUTION PARAMETERS

(71) Applicant: MICRON TECHNOLOGY, INC., Boise, ID (US)

(72) Inventors: Shane Nowell, Boise, ID (US); Steven Michael Kientz, Westminster, CO (US); Michael Sheperek, Longmont, CO (US); Mustafa N Kaynak, San Diego, CA (US); Kishore Kumar Muchherla, San Jose, CA (US); Larry J Koudele, Erie, CO (US); Bruce A Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/164,636

(22) Filed: Feb. 1, 2021

(65) Prior Publication Data

US 2022/0246207 A1 Aug. 4, 2022

(51) Int. Cl.
| | |
|---|---|
| *G11C 11/34* | (2006.01) |
| *G11C 11/56* | (2006.01) |
| *G11C 16/10* | (2006.01) |
| *G11C 16/26* | (2006.01) |
| *G11C 16/30* | (2006.01) |

(52) U.S. Cl.
CPC ...... *G11C 11/5642* (2013.01); *G11C 11/5628* (2013.01); *G11C 16/10* (2013.01); *G11C 16/26* (2013.01); *G11C 16/30* (2013.01)

(58) Field of Classification Search
CPC .......... G11C 16/10; G11C 16/26; G11C 16/30
See application file for complete search history.

(56) References Cited

U.S. PATENT DOCUMENTS

| | | | |
|---|---|---|---|
| 9,633,740 B1 * | 4/2017 | Alhussien | G11C 16/16 |
| 9,921,749 B2 | 3/2018 | Kim et al. | |
| 11,222,704 B1 | 1/2022 | Rayaprolu | |
| 11,263,134 B1 | 3/2022 | Sheperek et al. | |
| 2017/0271031 A1 * | 9/2017 | Sharon | G06F 11/3058 |
| 2017/0358346 A1 | 12/2017 | Zhang | |
| 2020/0058359 A1 | 2/2020 | Lee | |
| 2020/0098438 A1 | 3/2020 | Lu | |
| 2021/0193231 A1 | 6/2021 | Luo et al. | |
| 2022/0084596 A1 | 3/2022 | Sheperek et al. | |
| 2022/0100413 A1 | 3/2022 | Kim | |

* cited by examiner

*Primary Examiner* — Uyen Smet
(74) *Attorney, Agent, or Firm* — Lowenstein Sandler LLP

(57) ABSTRACT

A method can include receiving a request to read data from a memory cell of a memory device coupled with the processing device, determining a voltage distribution parameter value associated with the memory cell, determining a set of read levels associated with the voltage distribution parameter value, wherein each read level in the determined set of read levels corresponds to a respective voltage distribution of the memory cell, and reading, using the determined set of read levels, data from the memory cell. The voltage distribution parameter value can be determined by identifying a particular voltage distribution of the memory cell by sampling the memory cell at a plurality of voltage levels, and determining the voltage distribution parameter value based on the particular voltage distribution. The voltage distribution parameter value can be a voltage value that is included in the particular voltage distribution.

20 Claims, 9 Drawing Sheets

ERROR AVOIDANCE BASED ON VOLTAGE DISTRIBUTION PARAMETERS

TECHNICAL FIELD

Embodiments of the disclosure relate generally to memory sub-systems, and more specifically, relate to error avoidance using features of voltage distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
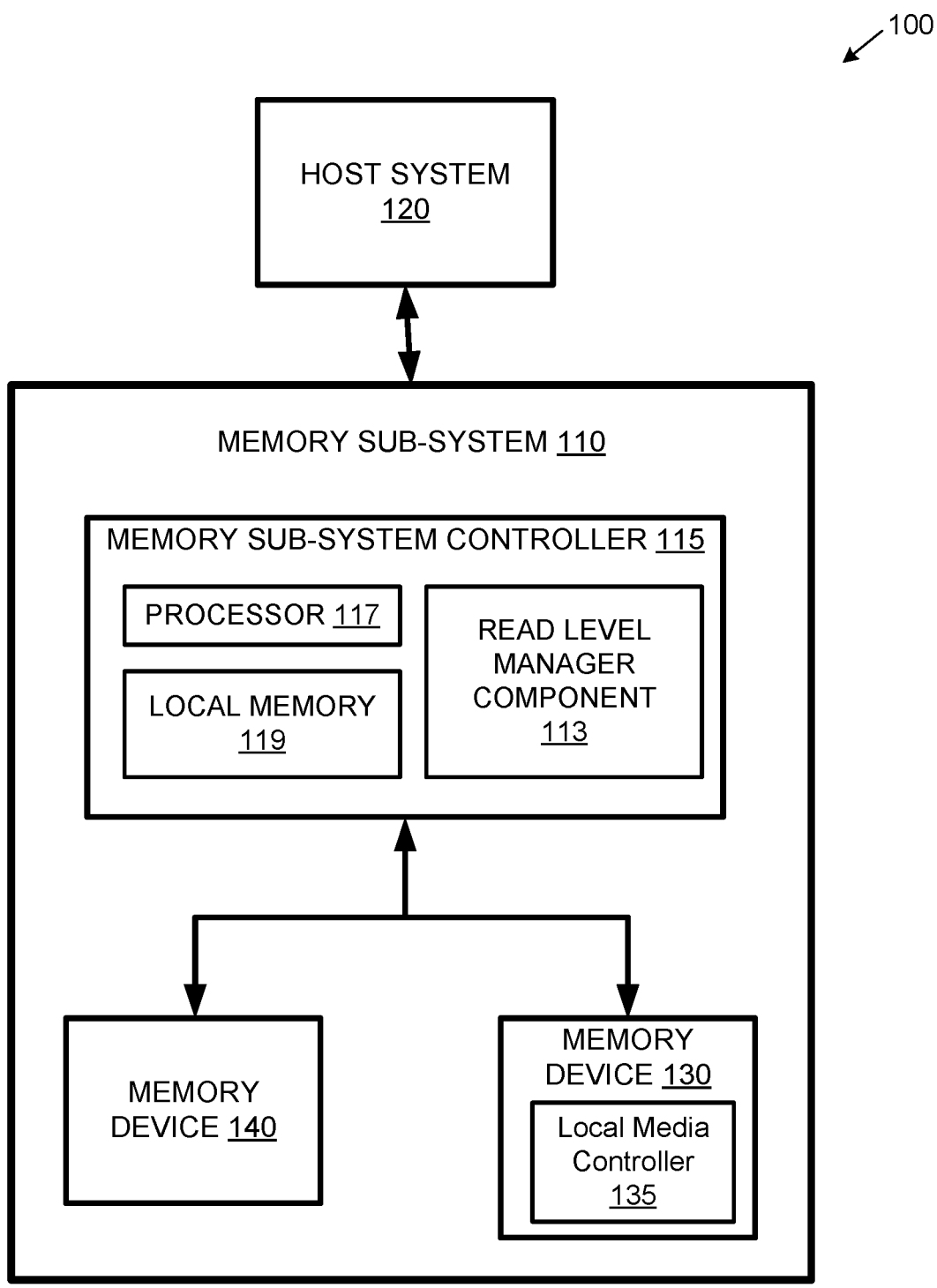
FIG. 1 illustrates an example computing system that includes a memory sub-system in accordance with some embodiments of the present disclosure.

Aspects of the present disclosure are directed to error avoidance in memory devices using voltage distribution parameters, such as a voltage that corresponds to a voltage distribution and changes over time as the voltage distribution changes due to slow charge loss. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dice. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error correction code (ECC), parity data), data version (e.g. used to distinguish age of data written), valid bitmap (which LBAs or logical transfer units contain valid data), etc.

A memory device includes multiple memory cells, each of which can store, depending on the memory: cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows multiple threshold voltage levels to be used, corresponding to different logical levels. Multiple threshold levels allow a single memory cell to store multiple bits of information: a memory cell operated with $2^n$ different threshold voltage levels is capable of storing n bits of information. Thus, a read operation can be performed by comparing the measured voltage exhibited by the memory cell to one or more threshold voltage levels in order to distinguish between two logical levels for single-level cells and between multiple logical levels for multi-level cells.

"Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information. "Superblock" herein shall refer to a set of blocks that span multiple die that are written in an interleaved fashion. In some cases, a superblock can span all the die within a storage device such as an SSD. A superblock can contain multiple blocks from a single die, such as one per plane. Drives can generally manage the erasure and programming of data on a superblock basis.

"Read level" herein shall refer to a voltage position. Read levels are numbered in increasing voltage from L1 through $2^n$, wherein n is the number of bits that can be stored in the cell. As an example, for triple level cells (TLC) corresponding to 3 bits per cell, there can be 8 threshold distributions (levels), and 7 read thresholds (read threshold voltages) can be used to differentiate between the levels. "Read level value" herein shall refer to a voltage or Digital-to-Audio Converter (DAC) value representing a voltage that is applied to the read element (often, the control gate for a NAND cell) for purposes of reading that cell. "Read level offset" herein shall refer to a component of the equation that determines the read level value. Read level offsets can be summed (e.g., read level value=offset_a+offset_b+ . . . ). "Read level base" herein shall refer to one of the read level offsets. Read level bases can be stored in the metadata of the memory device, for example. Each read level can correspond to one of the threshold levels described above. "Calibration" herein shall refer to altering a read level value (possibly by adjusting a read level offset or read level base) to better match the ideal read levels for a read or set of reads.

A write operation can store a logical value, e.g., zero or one, in a memory cell by applying a "program" voltage that corresponds to the logical value to a write gate of the cell. A read operation can be performed by applying a read voltage to a control gate of a memory cell and determining whether the read voltage is sufficient to overcome the voltage that was stored at the cell. As an example, in a single-level cell, a first voltage level (e.g., 0 volts) can correspond to a logical one, and a second voltage level (e.g., 3 volts) can correspond to a logical zero. A logical zero can be stored by applying 3 volts to the write gate and a logical one corresponds to the erased distribution, which corresponds to 0 volts in this example. To read the cell, a voltage can be applied to control gate of the cell. If the applied read voltage causes the transistor to conduct, then the voltage stored in the cell is less than the applied voltage. Thus, a voltage between the first and second voltage levels can subsequently be applied to the control gate to determine whether a logical zero or one is stored in the cell. For example, if 1.5 volts are applied to the control gate, and the cell threshold voltage is at 3 volts (logical zero), then the transistor does not conduct (because the applied 1.5 volts does not overcome the written 3 volts), and the stored value can be determined as being a logical zero. Alternatively, if the cell threshold voltage is at 0 volts (logical one), and 1.5 volts are applied to the control gate, the transistor conducts (because the applied 1.5 volts overcomes the written volts), thereby indicating a logical one.

As discussed above, n bits of information can be stored in a memory cell using multiple voltage levels. The read voltage level can be understood as corresponding to the valley between two distributions of voltages, as described below. The read voltage level can be between two threshold voltages, each of which can separate the voltage level from another voltage level. To store n bits of information, $2^n$ threshold distributions (levels) can be defined. To read $2^n$ threshold distributions, $2^n-1$ read thresholds (read values) can be established. For example, to store 2 bits of information, which can represent four different logical values, the corresponding threshold voltages can be 1 volt, 2 volts, and 3 volts. A particular logical value can be stored in the cell by applying the program voltage level that corresponds to the logical value to a write gate of the cell. Then, to read the two bits of information from the cell, three operations can be performed to identify the voltage that overcomes the voltage that was stored in the cell: apply 0.5 volts on the control gate and read (e.g., by determining whether the transistor conducts), apply 1.5 volts and read, and apply 2.5 volts and read. The results can be used to determine the values of the two logical bits. If applying 0.5 volts causes the transistor to conduct, then 0.5 volts has overcome the written voltage, so the written voltage is 0 volts (e.g., logical zero). Similarly, if applying 1.5 volts causes the transistor to conduct, then the written voltage is 1 volts (e.g., logical one), and the threshold voltage is 1.5 volts. If applying 2.5 volts causes the transistor to conduct, then the written voltage is 2 volts (e.g., logical three). Otherwise, the written voltage is 3 volts (e.g., logical two). When writing, the voltage that is placed on the write gate is inexact and, over a number of memory cells, can be represented as a distribution of voltages around each of the program voltage levels. Thus, in a cell that stores a voltage that can be interpreted as representing two bits, there are four corresponding threshold voltage distributions. Each distribution can be understood as a curve having a peak, representing a highest occurrence rate, at the corresponding program voltage level. Each voltage distribution can have rates that decrease on the left and right sides of the peak. The rates can decrease toward minimum values that approach rates of 0 at voltages (below and above the program voltage level) on the left and right sides of the peak. The voltages of the minimum rates can correspond to the threshold voltages at the boundaries between the voltage distribution and neighboring voltage distributions.

Because of the phenomenon known as slow charge loss ("SCL"), the threshold voltage of a memory cell change over time as the electric charge of the cell degrades, which is referred to as "temporal voltage shift" (since the degrading electric charge causes the voltage distributions to shift along the voltage axis towards lower voltage levels). Temporal voltage shift (TVS) herein shall refer to a change in the measured voltage of cells as a function of time. Temporal Voltage Shift can include different components such as intrinsic charge loss, system charge loss, quick charge loss, etc. Memory formed from certain NAND technologies generally exhibits more TVS than floating gate NAND. TVS is generally increased by Program Erase Cycles (PEC), higher temperatures, and higher program voltages. TVS shows significant die-to-die variation. In memory that exhibits TVS, the threshold voltage is changing rapidly at first (immediately after the memory cell was programmed), and then slows down in an approximately logarithmic linear fashion with respect to the time elapsed since the cell programming event. If not mitigated, the temporal voltage shift caused by the slow charge loss can result in the increased bit error rate in read operations.

Aspects of the present disclosure address the above and other deficiencies by providing a memory sub-system controller that determines read level values suitable for mitigation of the temporal voltage shift by measuring a voltage distribution parameter value ("parameter value") for each block or group of blocks stored in a memory device, and identifying read level values that correspond to the parameter value. The memory sub-system controller can use the read level values when reading data from the block or group of blocks to mitigate the temporal voltage shift. The parameter value can be, for example, a voltage corresponding to a particular feature of a voltage distribution of a memory cell.

The particular feature can be, for example, a characteristic of the voltage distribution, such as a peak, median, mean, or mode of the voltage distribution. The parameter value changes over time, and can correspond to an amount of temporal voltage shift of the memory cell. The memory sub-system controller can use particular parameter value to determine read levels that are suitable for an amount of temporal voltage shift that corresponds to the particular parameter value. "Distribution voltage" herein shall refer to a distribution parameter value that is a voltage and corresponds to a particular feature of a voltage distribution of a memory cell. For example, a distribution voltage can be understood as the voltage value that corresponds to a peak of a voltage distribution. The distribution voltage can be the median, mean, mode, or other characteristic of the voltage distribution. The voltage distribution can be a particular one of the voltage distributions of a memory cell, e.g., the 7th voltage distribution (or other designated voltage distribution) of a triple-layer memory cell that can store a voltage that can represent eight values corresponding to 8 voltage distributions numbered 0 through 7. The memory sub-system controller can look up the read level values that correspond to a particular parameter value in a mapping table that maps parameter values to corresponding read level values. For example, the mapping table can be a voltage mapping table that maps distribution voltages to read levels. The voltage mapping table can be generated from empirical data using a process that identifies distribution voltages that correspond to suitable read level values (e.g., read level values that produce low error rates, high accuracy, or the like).

In some embodiments, interpolation can be used to determine the read levels for distribution voltages that are not present in the voltage mapping table. If a distribution voltage is not in the voltage mapping table, the memory sub-system controller can determine the read level values for the distribution voltage by interpolation between two chosen voltage values in the mapping table that are, respectively, greater than and less than the distribution voltage. For example, the first chosen voltage value can be the greatest voltage value in the mapping table that is less than the distribution voltage, and the second chosen voltage value can be the least voltage value in the mapping table that is greater than the distribution voltage. The read levels can be determined as an average of the first and second voltage values. For example the difference between the first voltage and the distribution voltage can be used to weight the read level values associated with the first value relative to the read level values associated with the second value in a weighted average calculation.

In particular embodiments, instead of measuring the distribution voltage of a block for each memory read operation, the memory sub-system controller can measure the distribution voltage of a block less frequently, and store the distribution voltage in a block metadata table or other mapping table that associates blocks with distribution voltages. For example, the distribution voltage of a block can be measured and stored in the block metadata table each time that the time since program of the block increases by a threshold amount, e.g., 50%, from the previous time the distribution voltage of the block was measured. The memory sub-system controller can then retrieve the distribution voltage for a particular block from the block metadata table, e.g., by looking up the distribution voltage that corresponds to the block in the block metadata table for each memory read operation. The memory sub-system controller can then use the voltage mapping table to determine the read levels that correspond to the distribution voltage. Storing the distribution voltage in association with the block in this and accessing the stored distribution voltage in read operations in this way enables read operations to be performed quickly and efficiently, without substantial additional delay to identify the read levels based on the distribution voltage.

A distribution voltage can be understood as representing a "position" of a distribution that along an axis. The position can correspond to a feature, such as a peak, of a particular voltage distribution, such as the 7th voltage distribution, of a memory cell. As time after program increases, the position of the feature of the particular distribution, which is represented by the distribution voltage, moves toward lower voltages that reflect the state of the temporal voltage shift. The memory sub-system controller can measure the distribution voltage as a value of a voltage at a particular memory cell of a block. The measured distribution voltage can be used to determine read level values for the memory cell and for other memory cells that are likely to have a similar amount of temporal voltage shift, such as other memory cells that store data for the same block or superblock as the measured memory cell. At a particular time after program, the memory sub-system can mitigate the temporal voltage shift effect when performing a read operation by measuring the position of a feature of the particular voltage distribution ("distribution position"), such as the voltage of the median of the distribution, at a particular memory cell, and mapping the measured position (e.g., distribution voltage) to read level values that have previously been determined to correspond to the distribution position. The memory sub-system can use the read level values to read data from the memory cell.

Advantages of the present disclosure include, but are not limited to, a lower number of operations performed to determine read levels than in other techniques that attempt to mitigate the effects of temporal voltage shift. For example, according to the present disclosure, operations that determine read level offsets can be performed on demand, e.g., in response to requests to access particular blocks, without additional overhead or complexity of garbage-collection-related operations that can run indefinitely during system operation. Read level offsets for a block or group of blocks change in accordance with the age of the block because the distribution voltage changes to values that correspond to older blocks as a result of the temporal voltage shift effect itself. Further, entries in the block metadata table can be deleted when the block is written to.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every data payload (e.g., user data) utilizes multiple dies of the memory devices 130, 140 (e.g., NAND type flash memory devices), such that the payload is distributed through a subset of dies, while the remaining one or more dies are used to store the error correction information (e.g., party bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read level manager component 113 that can determine suitable read levels for memory cells based on voltages associated with particular features of voltage distributions of memory cells. As described above, temporal voltage shift causes the threshold read levels of a memory cell to change over time. The read levels determined based on distribution voltages as described below can mitigate the effects of temporal voltage shift. When writing data to a memory cell, it is inexact how much voltage is placed on the written gate of the cell. Thus, for writes of specified target voltages to a number of memory cells, there is a distribution of voltages around each of the target voltages. A voltage distribution can be a distribution of threshold voltages across a plurality of memory cells programmed to particular a state associated with the voltage distribution.

The read level manager component 113 can perform a calibration scan at particular times to measure the distribution voltages associated with the particular features of the voltage distributions of one or more cells in each block (or superblock or other storage unit), and store the measured distribution voltages in a block metadata table in association with the block. A read operation, the read level manager component 113 can determine the distribution voltage that corresponds to a block by looking up the block in the block metadata table and retrieving the distribution voltage that corresponds to the block from the block metadata table. The read level manager component 113 can then determine suitable read levels for the read operation by looking up the read levels that correspond to the voltage in a voltage mapping table, and perform the read operation by reading data from the block using the read levels.

In particular embodiments, the memory sub-system controller 115 includes at least a portion of the read level manager component 113. For example, the memory sub-system controller 115 can include a processor 117 (processing device) configured to execute instructions stored in local memory 119 for performing the operations described herein. In some embodiments, the read level manager component 113 is part of the host system 110, an application, or an operating system. Further details regarding the read level manager component 113 are described below.

Figure 2:
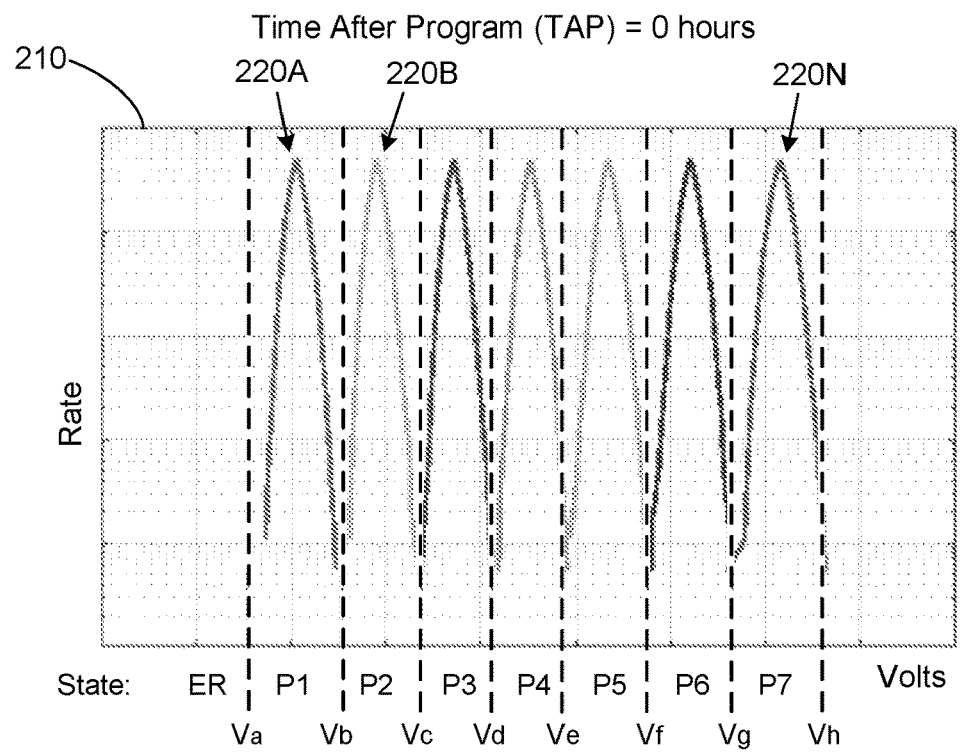
FIG. 2 schematically illustrates the temporal voltage shift caused by the slow charge loss exhibited by triple-level memory cells, in accordance with some embodiments of the present disclosure.
Figure 2:
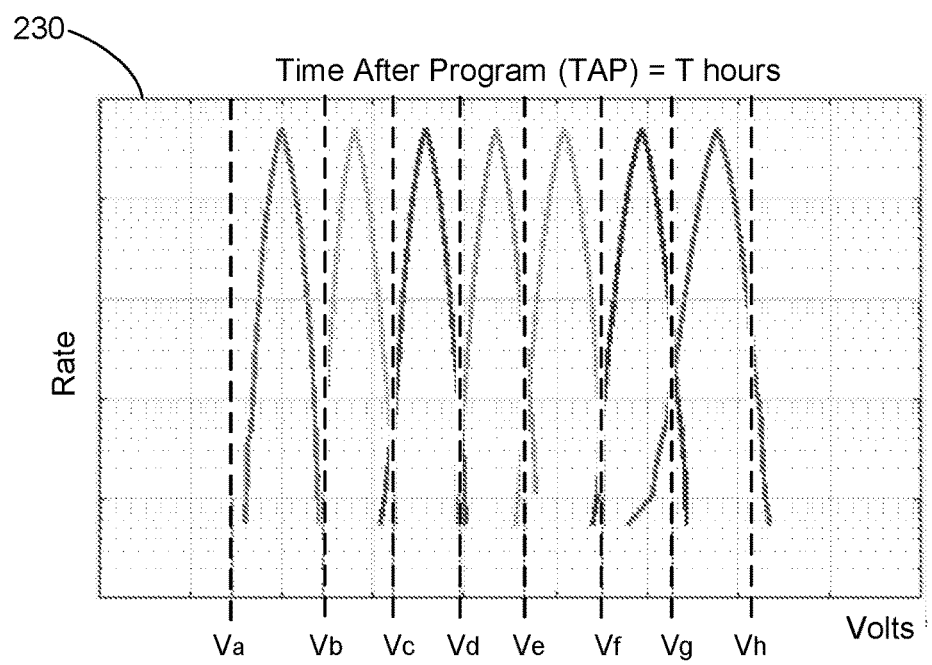

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels. A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrates program voltage distributions 220A-220N (also referred to as "program distributions" or "voltage distributions" or "distributions" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions. In chart 210, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is a primary driver of TVS (temporal voltage shift), along with temperature. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes).

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages can be adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
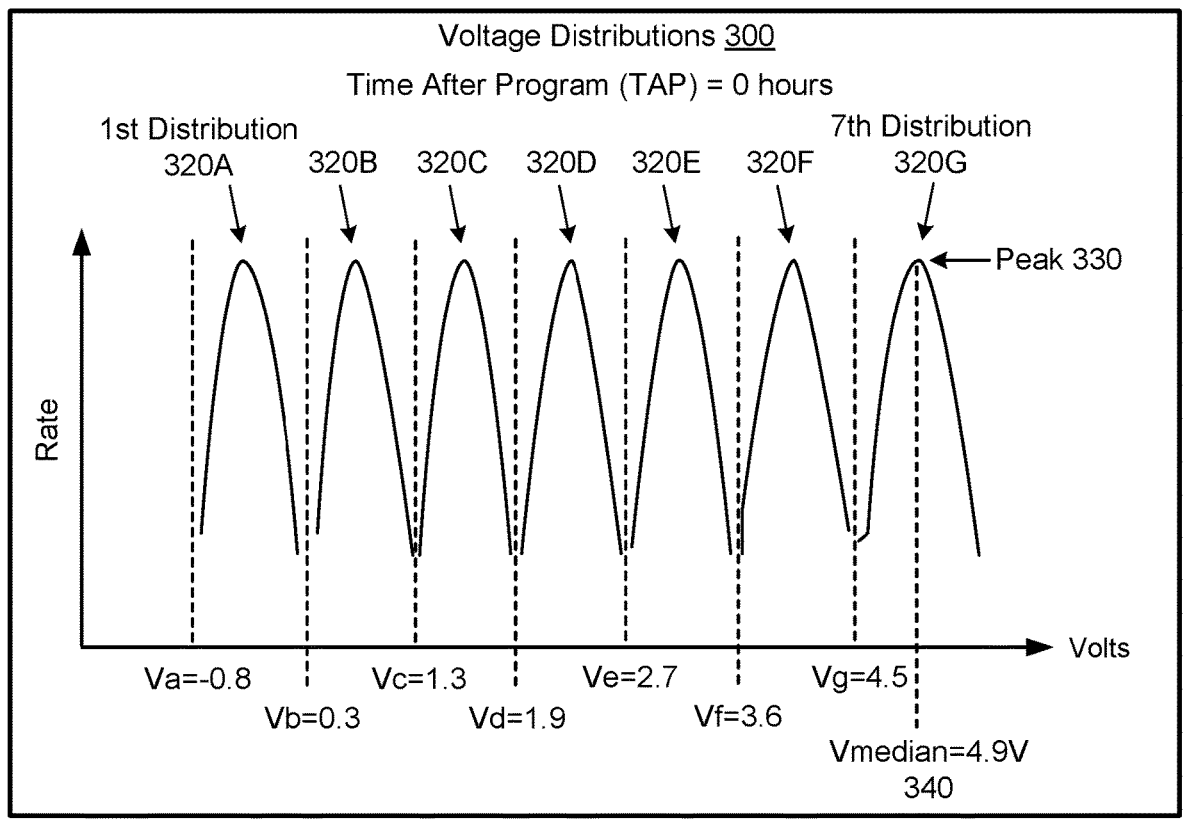
FIG. 3 schematically illustrates distribution voltages that correspond to particular features of voltage distributions and changes in the voltage distributions and distribution voltages over time, in accordance with some embodiments of the present disclosure.
Figure 3:
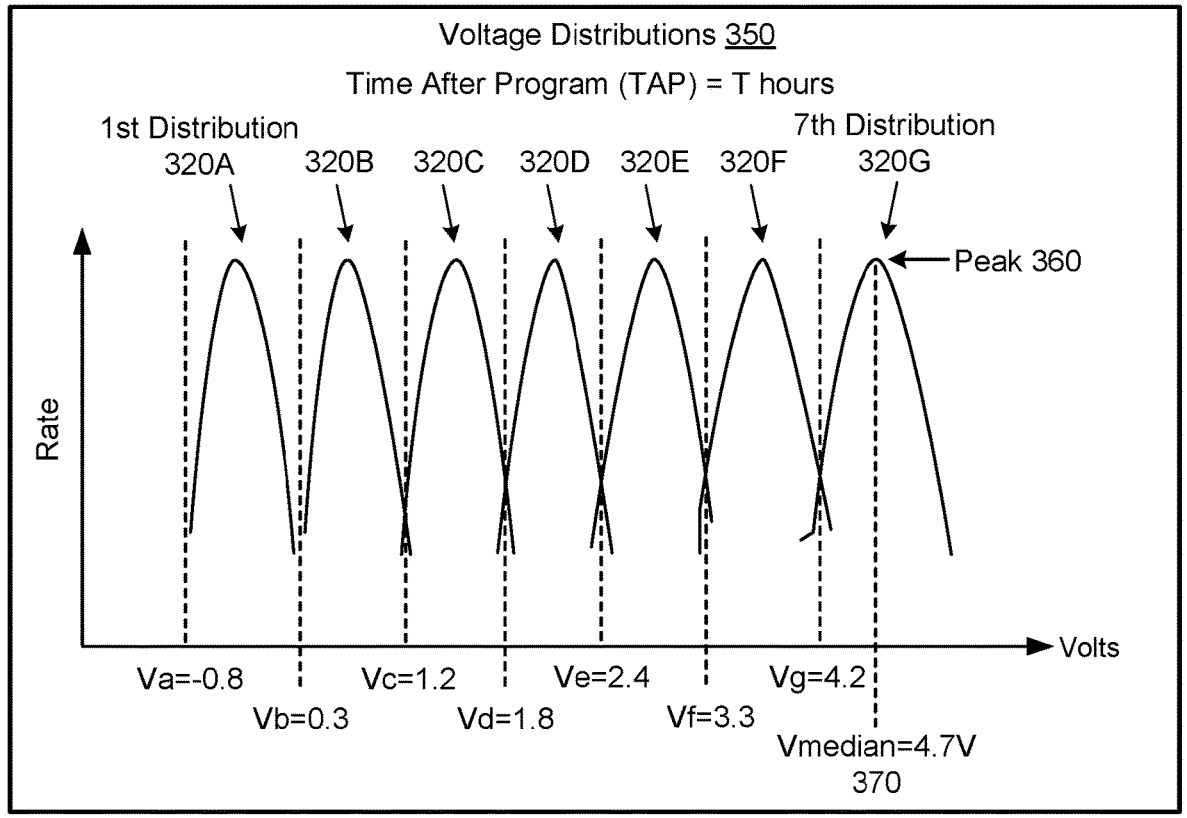

FIG. 3 schematically illustrates distribution voltages that correspond to particular features of voltage distributions and changes in the voltage distributions and distribution voltages over time, in accordance with some embodiments of the present disclosure. While the illustrative example of FIG. 3 utilizes triple-level cells, the same observations can be made and, accordingly, the same remedial measures are applicable to single level cells and any memory cells having multiple levels. FIG. 3 shows a chart 300 that illustrates voltage distributions of a memory cell at a time after program (TAP) of 0 hours, and a chart 350 that illustrates voltage distributions of the memory cell at a subsequent TAP of T hours. As described above with respect to FIG. 2, the voltage distributions 320A-G have moved after T hours, as shown in chart 350.

Each of chart 300 and 350 illustrates seven program voltage distributions 320A-320G of memory cells programmed by a respective write level (which can be assumed to be at the midpoint of the program distribution) to encode a corresponding logical level. The program distributions 320A through 320G are similar to the program distributions 220A through 220N described above with respect to FIG. 2. Each memory cell has eight states, which include an erase state corresponding to voltages below the first voltage distribution 320A, and seven logical level states corresponding to the seven voltages distributions 320A through 320G.

The voltage distributions 320A through 320G can illustrate the range of threshold voltages (e.g., normal distribution of threshold voltages) for memory cells programmed at respective write levels (e.g., program voltages). As described above with respect to FIG. 2, in order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

Each voltage distribution 320A-320G corresponds to a logical level. The read threshold voltage levels are labeled Va-Vh. Any measured voltage below Va is associated with the erase state. For example, a measured voltage is associated with the erase state or one of seven program states P1-P7 depending on the relation of the measured voltage to a threshold or pair of thresholds, as shown in Table 1 below.

TABLE 1

| Lower Threshold | Upper Threshold | State |
|---|---|---|
| None | Va | Erase |
| Va | Vb | P1 |
| Vb | Vc | P2 |
| Vc | Vd | P3 |
| Vd | Ve | P4 |
| Ve | Vf | P5 |
| Vf | Vg | P6 |
| Vg | None | P7 |

As shown in chart 300, at TAP=0 the threshold voltage levels have the values Va=−0.8, Vb=0.3, Vc=1.3, Vd=1.9, Ve=2.7, Vf=3.7, and Vg=4.5 volts. A distribution voltage can be calculated based on one or more of the voltage distributions 320A-320G. For example, a distribution voltage can correspond to the position on the voltage axis of a feature such as a peak 330 of the seventh distribution 320G. The distribution voltage can be calculated as a function of the seventh distribution 320G, e.g., the median, mean, mode, or other function of the distribution. In the example of chart 300, the distribution voltage is shown as Vmedian 340, which is calculated as the median of the seventh distribution 320G at TAP=0 and has the value 4.9 volts.

As shown in chart 350, at TAP=T hours, the threshold voltage levels have the values Va=−0.8, Vb=0.3, Vc=1.2, Vd=1.8, Ve=2.4, Vf=3.3, and Vg=4.2 volts. The peak of the seventh distribution 320G at TAP=T is shown as peak 360. In the example of chart 350, the distribution voltage is shown as Vmedian 370, which is calculated as the median of the seventh distribution 320G at TAP=T and has the value 4.7 volts.

Although particular features of particular voltage distributions, such as the median of the seventh voltage distribution, are described above, any suitable feature of any voltage distribution can be used to determine a distribution voltage. For example, the mean of the 6th voltage distribution 320F can be used as a distribution voltage. As another example, the distribution voltage can be calculated as the 90th percentile of the 7th voltage distribution, which corresponds to a lower right side of the distribution. In another example, the distribution voltage can be calculated as a mean (e.g., average) of the 25th and 75th percentile of the 7th voltage distribution. In yet another example, the distribution voltage can be calculated as a mean of the means of the 6th and 7th voltage distributions. In particular embodiments, higher-numbered distributions are used to calculate the distribution voltage, since higher-numbered distributions move more quickly over time than lower-numbered distributions, and hence higher-numbered distributions carry a stronger signal of TVS. In other embodiments, one or more lower-numbered distributions can be used to calculate the distribution voltage, however. For example, the distribution voltage can be calculated as a mean of the means of the 1st distribution 320A and the 7th distribution 320G.

Figure 4A:
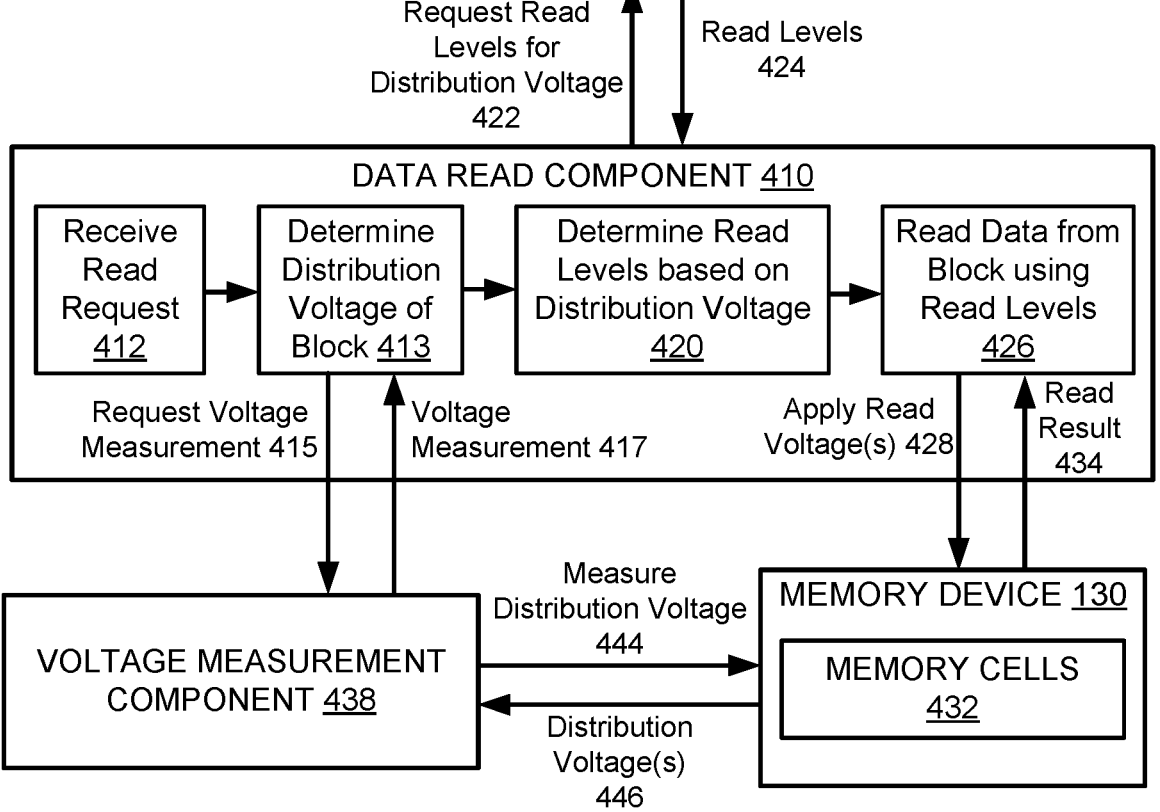
FIGS. 4A and 4B depict example read level manager components, in accordance with some embodiments of the present disclosure.

FIG. 4A depicts an example read level manager 402, in accordance with some embodiments of the present disclosure. The read level manager 402 can correspond to the read level manager component 113 of the memory sub-system controller 115 shown in FIG. 1. The read level manager 402 can include a voltage mapping table 406, which can be stored in local memory 119 of the memory sub-system controller 115 or other suitable memory, such as a memory of the host system 120. The voltage mapping table 406 can store mappings between distribution voltages and sets of read levels. For each distribution voltage that is associated with a set of read levels, the voltage mapping table 406 can include a row containing the distribution voltage $V_M$ and the set of read levels $RL1_M$-$RLN_M$. In the example of FIG. 4A, the voltage mapping table 406 includes three entries for the distribution voltages 4.9, 4.7, and 4.3, as shown in Table 2 below.

TABLE 2

| Feature Voltage | Read Level 1 | Read Level 2 | Read Level 3 | Read Level 4 | Read Level 5 | Read Level 6 | Read Level 7 |
|---|---|---|---|---|---|---|---|
| 4.9 | −0.8 | 0.3 | 1.3 | 1.9 | 2.7 | 3.6 | 4.5 |
| 4.7 | −0.8 | 0.3 | 1.2 | 1.8 | 2.4 | 3.3 | 4.2 |
| 4.3 | −0.9 | 0.2 | 1.1 | 1.7 | 2.5 | 3.0 | 4.0 |

The example read levels in the voltage mapping table 406 for distribution voltages 4.9V and 4.7V correspond to the threshold voltages associated with Vmedian=4.9V and Vmedian=4.7V, respectively, in FIG. 3. Although the voltage mapping table 406 is described as containing read levels, which can be used in read operations, the voltage mapping table 406 can alternatively or additionally contain read level offsets, which can be added to base read levels to determine the read levels to use in read operations. The voltage mapping table 406 can be generated by a voltage mapping table generator (not shown), e.g., using an empirical process. The empirical process can, for example, perform read operations on memory cells 432 of memory device 130 using a range of distribution voltages, and analyze results received from the memory cells 432 to determine the read levels for the range of distribution voltages, as described below. In one embodiment, the empirical data can be generated during qualification testing of one or more memory devices (e.g., NAND memory devices) and appropriately averaged and reduced to represent the expected voltage mapping. In another embodiment, the empirical data can be generated during a memory device (e.g., NAND) manufacturing process to include a larger population of dies with a similar data reduction process to represent the dies in a single voltage mapping table. In yet another embodiment, the empirical data can be collected during the storage device (e.g., SSD) manufacturing process and reduced to a voltage mapping table to represent the die within a group of storage devices or within a single storage device. In yet another embodiment, the empirical data can be generated within the storage device manufacturing process for each die within a storage device, and a separate voltage mapping table can be used for each die within the storage device.

The read level manager 402 can also include a data read component 410, which can receive read requests, determine suitable read levels, and read data from one or more memory devices, such as the memory device 130, using the determined read levels. The data read component 410 can include a read request receiver 412, a distribution voltage determiner 413, a read level determiner 420, and a data reader 426. The read request receiver 412 can receive data read requests from other components of the memory sub-system controller 115 or memory sub-system 110, or from the host 120. The data read request can specify a block, e.g., as a block ID.

The distribution voltage determiner 413 can determine a distribution parameter value, such as a distribution voltage, of the block specified in the read request. For example, to determine a distribution voltage of a group of memory cells 432 specified in or associated with a read request, the distribution voltage determiner 413 can send a voltage measurement request to a voltage measurement component 438 (arrow 415). The voltage measurement request can include an identifier or address that identifies the memory cells 432 for which a voltage is to be measured. The voltage measurement component 438 can measure a distribution voltage of the memory cells 432 specified in or associated with the read request (arrow 444). The voltage measurement component 438 can measure the distribution voltage by, for example, performing read operations on a group of memory cells that includes the specified memory cells 432, as described below. The voltage measurement component 438 can receive the measured distribution voltage from the memory cells 432 (arrow 446). The voltage measurement component 438 can then send the distribution voltage(s) to the distribution voltage determiner 413 (arrow 417).

The read level determiner 420 can send a query specifying the distribution voltage to the voltage mapping table 406 (arrow 422). If the voltage mapping table 406 contains a mapping from the specified distribution voltage to corresponding read levels, the corresponding read levels can be provided to the read level determiner 420 (arrow 424).

If the voltage mapping table 406 does not contain a mapping from the specified distribution voltage to read levels, the read level determiner 420 can perform interpolation between first and second distribution voltages that are present in the voltage mapping table 406 to determine the read levels that correspond to the specified distribution voltage based on other read levels that are present in the voltage mapping table 406. The specified distribution voltage is referred to as a "target distribution voltage" in the following description. The difference between the first value and the target distribution voltage can be used to weight the read level voltages associated with the first value relative to read level values associated with the second value in a weighted average calculation. The first distribution voltage can be identified as the closest distribution voltage that is less than the target parameter value, e.g., the maximum of distribution voltages in the voltage mapping table that are less than the target distribution voltage. The second distribution voltage can be identified as the closest distribution voltage that is greater than the target distribution voltage, e.g., the minimum of distribution voltages in the voltage mapping table that are greater than the target distribution voltage. Thus, interpolation can be performed between the read level values associated with the first value and the read level values associated with the second value to determine the read level values associated with the target distribution voltage.

The difference between the target distribution voltage and the closest distribution voltages less than and greater than the target distribution voltage in the voltage mapping table can be used to interpolate each read level value for the target distribution voltage as a weighted average of the corresponding read level values of the closest distribution voltages less than and greater than the target distribution voltage. The weight of each read level value corresponding to the closest distribution voltage less than the target distribution voltage can be proportional to the difference between the closest distribution voltage less than the target distribution voltage and the target distribution voltage. Similarly, the weight of each read level value corresponding to the closest distribution voltage greater than the target distribution voltage can be proportional to the difference between the closest distribution voltage greater than the target distribution voltage and the target distribution voltage. The read level determiner 420 can determine each read level value for the target distribution voltage as the weighted average of the corresponding read level values associated with the closest distribution voltages greater than and less than the target distribution voltage.

For example, if the target distribution voltage is 4.8V, and the first and second values are 4.7V and 4.9V respectively, then the target distribution voltage of 4.8V is at half of the difference between the first and second values. Accordingly, the determined read level values can be calculated as a weighted average in which the read level values associated with the first value have a weight of 0.5 and the read level values associated with the second value also have a weight of 0.5. The distribution voltage and the associated determined read level values can be stored in the voltage mapping table, so subsequent read requests for the same target distribution voltage can retrieve the read level values without performing interpolation.

As an example, the read levels generated by interpolation for the target distribution voltage 4.8V that is not in the voltage mapping table are shown below. The target voltage of 4.8V is between a first voltage 4.7 and a second voltage 4.9, both of which are in the voltage mapping table prior to the interpolation. The result of the interpolation, which is the row for target voltage 4.8V, is shown in Table 3 below. The read level determiner 420 that performs the interpolation can store the target distribution voltage in association with the read levels generated by interpolation in the voltage mapping table 406. Since the target distribution voltage of 4.8V is half the difference between the entry above (4.9V) and the entry below (4.8V), the weights of the entry above and the entry below are both 0.5. The controller can interpolate between the entry above and the entry below by computing each read level value as the weighted average ReadLevelAbove*0.5+ReadLevelBelow*0.5. Thus, the interpolated read level values for the distribution voltage of 4.8V are −0.8, 0.3, 1.2, 1.8, 2.4, 3.3, and 4.2 volts, as shown in Table 3.

TABLE 3

| Feature Voltage | Read Level 1 | Read Level 2 | Read Level 3 | Read Level 4 | Read Level 5 | Read Level 6 | Read Level 7 |
|---|---|---|---|---|---|---|---|
| 4.9 | −0.8 | 0.3 | 1.3 | 1.9 | 2.7 | 3.6 | 4.5 |
| 4.8 | −0.8 | 0.3 | 1.25 | 1.85 | 2.55 | 3.45 | 4.35 |
| 4.7 | −0.8 | 0.3 | 1.2 | 1.8 | 2.4 | 3.3 | 4.2 |

In particular embodiments, if the read level values in the voltage mapping table 406 are read level offsets instead of read levels, then the read level determiner 420 can add the read level offsets to base read levels to determine the read levels to be used in read operations. If interpolation is performed on read level offsets, the base read levels can be associated with the same distribution as the interpolated read level values to produce total read level values. The memory system controller can then perform the read operation using the total read level values.

The data reader 426 can read data from the block using the read levels from the read level determiner 420. The data reader 426 can apply the read levels to one or more memory cells 432 of the memory device 130 (arrow 428) and read the data from the memory cell(s) 432 (arrow 434). The data reader 426 can then provide the data to other components of the memory sub-system controller 115 or the host 120.

Alternatively or additionally, the voltage measurement component 438 can measure the distribution voltage(s) by performing a sufficient number of read operations using a range of threshold voltages to measure a voltage distribution of the memory cell, and calculating the median (or other function) of the measured voltage distribution. For example, the distribution voltage can be measured at a memory cell that is identified by the voltage measurement request (arrow 415). The voltage measurement component 438 can determine the distribution voltage by, for example, identifying a feature of the distribution, such as the peak, which can be the position of the distribution having the highest rate, and determining the voltage that corresponds to the identified position of the feature. Thus, the value of the measured distribution voltage can be the voltage that corresponds to the portion of the distribution having the highest rate. The distribution voltage can be understood as representing a position of the distribution along the voltage axis.

In particular embodiments, to generate the voltage mapping table 406, a heuristic technique can be used to identify read level values that produce desirable results from the memory cell, e.g., low error rates, high accuracy, or other desirable results for each of a selected range of values of the distribution voltage. For each selected of the distribution voltage, the corresponding read level values that produce the desirable results can be stored in association with the selected distribution voltage in the voltage mapping table. As an example, read error counts or other performance criteria can be evaluated during operation or simulation of similar memory cells using one or more selected ranges of the distribution voltage. For each distribution voltage in the selected range, a desirable set of read level values corresponding to the voltage distributions of a memory cell being operated or simulated can be identified by operating or simulating the memory cell for sets of read level values over ranges of values of the read level values. The distribution voltage that corresponds to the identified set of desirable read level values can be stored in the voltage mapping table in association with the identified set of desirable read level values.

Since the voltage distributions shift toward lower voltages over time, and the measured distribution voltage-to-read-level relation can be determined, e.g., by measuring a number of memory cells, the voltage-to-read-level relation can be used to map the distribution voltage, which can be represented as a voltage, to a read level value for the particular distribution. Further, since the shift of each distribution of a multi-level cell is related, the voltage relation can be used to map the distribution voltage to a set of read level values that correspond to the voltage distributions of a multi-level memory cell, e.g., seven read level values in an eight-level architecture (in which one level corresponds to an erase state). The voltage relation can be represented as, for example, a mapping, such as the voltage mapping table 406, that maps each distribution voltage, which can be represented as a voltage, to a set of read level values. The set of read level values can include a read level value for each of the memory cell's voltage distributions. Each read level value in the set can be, e.g., a read level value that can be added to a base or a read level offset that can be added to a base read level value. Furthermore, in some implementations read levels or read level offsets on table 406 can be determined as a function of program erase cycles.

As described above, upon receiving a request to read data from a memory cell, the memory sub-system controller 115 can determine read level values for the memory cell based on a distribution voltage. The memory sub-system controller can measure the distribution voltage at the memory cell. The previously-determined distribution voltage can be a distribution voltage measured at the memory cell or at another memory cell. The memory sub-system controller can then look up read level values that are associated with the measured or previously-determined distribution voltage in the voltage mapping table 406, and use the read level values to read data from the memory cell.

The number or range of values of the distribution voltage for which entries are generated in the voltage mapping table 406 can be determined by factors such as characteristics of the memory device, including the resolution of the measurements of the distribution voltages (e.g., the distribution voltage resolution), how suitable the entries are for interpolation, the minimum and maximum values of the distribution voltages, and the amount of memory (e.g., local memory 119) or other storage space available to store the voltage mapping table 406.

In particular embodiments, the voltage mapping table 406 can include an entry for each possible value of the distribution voltage. If the number of possible values is relatively small, e.g., the resolution of the distribution voltages is sufficiently coarse, such that the memory available to store the voltage mapping table 406 is sufficient to store an entry for each possible value of the distribution voltage, then a voltage mapping table generator (not shown) can include an entry in the mapping table for each possible value of the distribution voltage. For example, if the distribution voltages are measured as voltages represented by Digital Audio Converter (DAC) units, the number of possible distribution voltages can be relatively small. If sufficient storage space is available, the voltage mapping table 406 can include an entry for each possible DAC value (e.g., for each possible DAC value, an entry mapping the DAC value to the corresponding read level values). When the memory sub-system controller 115 performs a read operation on a block, the controller 115 can use the voltage mapping table 406 to identify the read level values that correspond to the block (e.g., a block, superblock, or other unit) by measuring the distribution voltage of a group of memory cells in which the block's data is stored, and identifying the read level values associated with the distribution voltage in the voltage mapping table. Since the voltage mapping table 406 in this example includes an entry for each possible distribution voltage, and each measured value of the distribution voltage is one of the possible values, the memory sub-system controller 115 can identify an entry in the voltage mapping table 406 specifying read level values for each block hat is read.

Alternatively, the voltage mapping table generator can select a subset of the possible values of the distribution voltage and generate a voltage mapping table 406 that includes an entry for each value in the subset, and interpolation can be used to determine read levels for voltages that are not present in the mapping table, as described above.

Figure 4B:
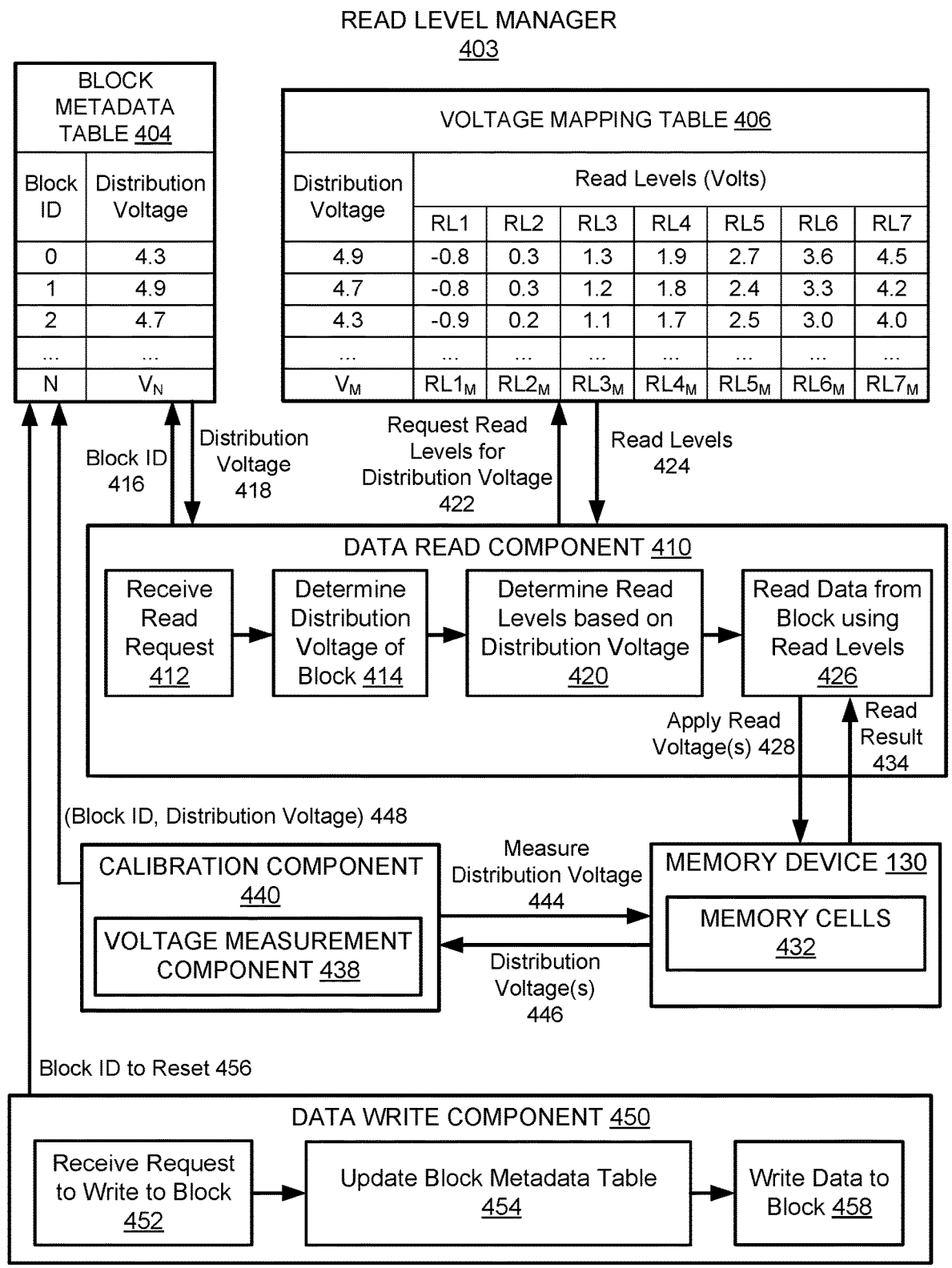

FIG. 4B depicts an example read level manager 403, in accordance with some embodiments of the present disclosure. The read level manager 403 can correspond to the read level manager component 113 of the memory sub-system controller 115 shown in FIG. 1. The read level manager 403 can include a block metadata table 404 and a voltage mapping table 406. The tables 404, 406 can be stored in local memory 119 of the memory sub-system controller 115 or other suitable memory, such as a memory of the host system 120. The block metadata table 404 can store mappings between blocks and distribution voltages. For each block that is associated with a distribution voltage, the block metadata table 404 can include a row containing a block identifier (ID) "N" of the block and the associated distribution voltage VN. In the example of FIG. 4B, the block metadata table 404 includes an entry mapping block ID "0" to distribution voltage 4.9, which indicates that the distribution voltage 4.3 has been determined for block ID "0". The block metadata table 404 also includes an entry mapping block ID "0" to distribution voltage 4.9, and an entry mapping block ID "2" to distribution voltage 4.7. The block metadata table 404 can be generated by a calibration component 440 and/or a data read component 410. Entries can be removed from the block metadata table 404 by a data write component, as described below.

In particular embodiments, the distribution voltage and the associated determined read level values can be stored in the block metadata table 404 in association with the block so subsequent read requests for the same value of the distribution voltage can retrieve the read level values. The determined distribution voltages and read level values can be stored in the block metadata table if, for example, there is sufficient memory or other storage available to store those values for each of the blocks. In another embodiment, each of the distribution voltages in the voltage mapping table, and the associated read level values, can be stored in the block metadata table instead of the voltage mapping table, in which case the mapping table need not be used. The voltage mapping table 406 can store mappings between distribution voltages and sets of read levels. The voltage mapping table 406 is further described above with respect to FIG. 4A.

The read level manager 403 can also include a data read component 410, a calibration component 440, and a data write component 450. As described above with respect to FIG. 4A, the data read component 410 can receive read requests, determine suitable read levels, and read data from one or more memory devices, such as memory device 130, using the determined read levels. The data read component 410 can include a read request receiver 412, a distribution voltage determiner 414, a read level determiner 420, and a data reader 426. The read request receiver 412 can receive data read requests from other components of the memory sub-system controller 115 or memory sub-system 110, or from the host 120. The data read request can specify a block, e.g., as a block ID.

The distribution voltage determiner 414 is similar to the distribution voltage determiner 413 described above with respect to FIG. 4A. The distribution voltage determiner 414 can determine a distribution parameter value, such as a distribution voltage, of the block specified in the read request. For example, the distribution voltage determiner 414 can query the block metadata table 404 for the distribution voltage having the block ID specified in the read request (arrow 416). If the block metadata table 404 contains the specified block ID, e.g., there is an entry in the metadata table 404 that maps the specified block ID to a distribution voltage, the distribution voltage determiner 414 can provide the corresponding distribution voltage to the read level determiner 420 (arrow 418), which can determine read levels as described below.

If the block metadata table 404 does not contain the specified block ID, the distribution voltage determiner 414 can measure a parameter value, such as a distribution voltage, for the block specified in the read request, and store the determined distribution feature in the block metadata table 404 in association with the block ID. The distribution voltage determiner 414 can measure the distribution voltage as described below with respect to the voltage measurement component 438 of the calibration component 440.

Alternatively, if the block metadata table 404 does not contain the specified block ID, the data read component 410 can use default read levels, or pass the read request to another component of the memory sub-system controller 115, which can perform the read operation. Although the parameter value is a voltage in the examples described herein, a parameter value can be any suitable data state metric. "Data state metric" herein shall refer to a quantity that is measured or inferred from the state of data stored on a memory device. Specifically, data state metrics can reflect the state of the temporal voltage shift, the degree of read disturb, and/or other measurable functions of the data state. A data state metric can be a function (e.g., a weighted sum) of a set of component state metrics.

If the block metadata table 404 contains the specified block ID, then, as described above, the distribution voltage determiner 414 can receive the distribution voltage associated with the block ID from the block metadata table 404 (arrow 418). The read level determiner 420 can send a query specifying the distribution voltage to the voltage mapping table 406 (arrow 422). If the voltage mapping table 406 contains a mapping from the specified distribution voltage to corresponding read levels, the corresponding read levels can be provided to the read level determiner 420 (arrow 424).

If the voltage mapping table 406 does not contain a mapping from the specified target distribution voltage to read levels, the read level determiner 420 can perform interpolation, as described above with respect to FIG. 4A. The read level determiner 420 that performs the interpolation can store the target distribution voltage in the block metadata table 404 in association with the block ID of the block for which the read levels are generated. The read level determiner 420 can also store the target distribution voltage in association with the read levels generated by interpolation in the voltage mapping table 406, as described above with respect FIG. 4A.

The data reader 426 can read data from the block using the read levels from the read level determiner 420. The data reader 426 can apply the read levels to one or more memory cells 432 of the memory device 130 (arrow 428) and read the data from the memory cell(s) 432 (arrow 434). The data reader 426 can then provide the data to other components of the memory sub-system controller 115 or the host 120.

The calibration component 440 can generate or update the block metadata table 404 separately from or at different times than the read operations performed by the data read component 410. For example, the calibration component 440 can perform calibration operations that generate or update the block metadata table 404 by, for each block, measuring distribution voltages of one or more groups of memory cells 432 that store the block's data, and storing the measured distribution voltages in the block metadata table 404 in association with the corresponding block ID. In this way, the block metadata table 404 can be generated and updated without delaying read operations performed by the data read component 410. The calibration component 440 can perform the calibration operations as part of a calibration scan at periodic times, or at other times.

The calibration component 440 can include a voltage measurement component 438, which can determine the distribution voltage of each block by performing one or more measurement operation on one or more groups of memory cells 432 in which the block's data is stored (arrow 444), e.g., similarly to the voltage measurement component 438 of FIG. 4A. The measurement operation(s) that determine the block's distribution voltage can, for example, measure at least a threshold number of voltages using a range of read levels. The voltage measurement component 438 can identify a voltage that corresponds to the feature based on the measured voltages. A measured voltage of a memory cell 432 can be a digital representation of a voltage exhibited by the memory cell 432. An Analog to Digital Convertor (ADC), such as a successive approximation ADC, can be used by the voltage measurement component 438 to perform the measurement.

Alternatively or additionally, the distribution voltage can be determined by performing a sufficient number of read operations using a range of threshold voltages to measure a voltage distribution of the memory cell, and calculating the median (or other function) of the measured voltage distribution. For example, the distribution voltage can be measured at a group of memory cells 432 that stores a portion of the block's data. The memory sub-system controller can determine the distribution voltage by, for example, identifying the feature of the distribution, such as the peak, which can be the position of the distribution having the highest rate, and determining the voltage that corresponds to the identified position of the feature. Thus, the value of the measured distribution voltage can be the voltage that corresponds to the portion of the distribution having the highest rate. The distribution voltage can be understood a representing a position of the distribution along the voltage axis. The parameter value can be stored in a block metadata table 404 in association with the block, so subsequent read requests for the block can access the parameter value more efficiently (e.g., without performing the measurement operation on the memory cell). The block metadata table can be stored in a local memory 119 of the memory sub-system.

The calibration component 440 can receive the distribution voltage measured from the memory cells 432 (arrow 446) and store the measured distribution voltage in association with the block ID of the block in the block metadata table 404 (arrow 448). The calibration component 440 can perform the calibration operation repeatedly, e.g., at time intervals, so that the distribution voltages associated with the block IDs in the block metadata table are updated over time to reflect changes in the distribution voltages in accordance with temporal voltage shift.

The data write component 450 can process requests to write data to blocks. Since writing data to a block involves relocating valid block data to another block (e.g., via garbage collection or folding) and then erasing the block, writing data to the block resets the amount by which the read thresholds of the block's memory cell(s) have shifted back to 0 volts, or at least close to 0 volts. Thus, the distribution voltage stored in the block metadata table 404 can be reset accordingly, e.g., by deleting the entry for the block from the block metadata table 404, or changing the distribution voltage associated with the block in the block metadata table 404 to an initial distribution voltage that corresponds to an initial time at which little or no temporal voltage shift has occurred (e.g., TAP=0, as shown in chart 300 of FIG. 3).

Accordingly, a write request receiver 452 of the data write component 450 receives each request to write data to a block, and a block metadata table updater 454 resets the entry that corresponds to the block in the block metadata table 454. For example, the metadata table updater 454 can delete the entry for the block from the metadata table 404, or change the distribution voltage associated with the block in the metadata table 404 to the initial distribution voltage described above. The metadata table updater 454 can send a delete or update operation to the block metadata table 404 (arrow 456). The delete or update operation can include the block ID of the block to be reset or deleted from the block metadata table 404. A data writer 458 can write data to the block subsequently to or concurrently with the metadata table 404 update operation. Subsequently, the calibration component 440 can update the distribution voltage associated with the block in the metadata table 404 to parameter values that change over time, thereby mitigating the effects of temporal voltage shift on read operations.

As described above, upon receiving a request to read data from a memory cell associated with a block or group of blocks, the memory sub-system controller 115 can determine read level values for the memory cell based on a distribution voltage. The memory sub-system controller can measure the distribution voltage at the memory cell or retrieve a previously-determined distribution voltage. The previously-determined distribution voltage can be a distribution voltage measured at the memory cell or at another memory cell associated with the block or group of blocks. The previously-determined distribution voltage can be retrieved from a block metadata table 404 or other data structure that associates the previously-determined data state with the block or group of blocks. The memory sub-system controller can then look up read level values that are associated with the measured or previously-determined distribution voltage in the voltage mapping table, and use the read level values to read data from the memory cell.

The memory sub-system controller 115 can periodically perform a calibration process in order to measure a distribution voltage for each unit of storage (e.g., block, group of blocks, or other unit of storage). The calibration process can associate each unit of storage with the distribution voltage determined for the unit of storage. The memory sub-system controller can measure the distribution voltage as part of the calibration process. For example, in the calibration process, the memory sub-system controller can measure the distribution voltage at a particular time and again at a subsequent time, e.g., at periodic intervals, or after a threshold time period passes subsequent to the next write operation associated with the memory cell. The calibration process can also delete entries from the block metadata table 404 that are no longer needed, e.g., because the blocks have been written to subsequent to the most recent update of the block metadata table entries. The calibration process can be performed as part of a calibration scan. Alternatively or additionally, the memory sub-system controller can delete or request deletion of block metadata table entries for a particular block upon the block being written to (since the write resets the temporal voltage shift) or erased (since the block is no longer in use) or otherwise becoming unused.

Figure 5A:
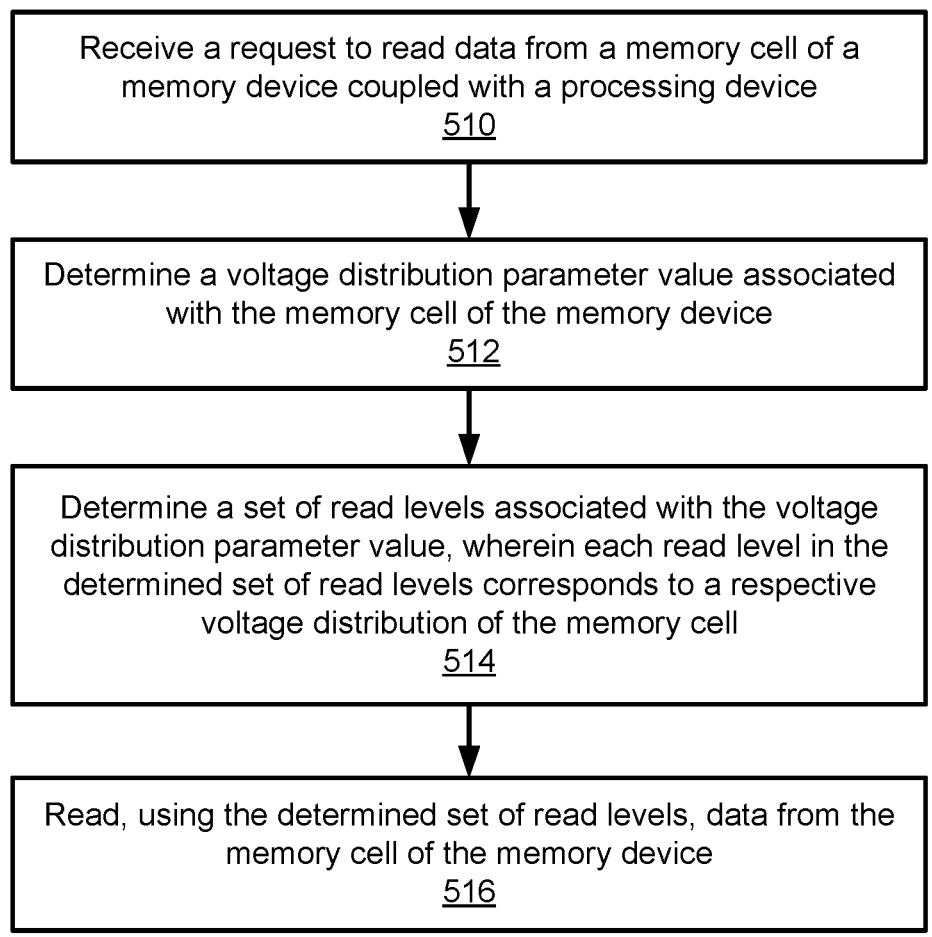
FIG. 5A is a flow diagram of an example method to determine read levels based on a distribution voltage of a memory cell and read data using the determined read levels, in accordance with aspects of the present disclosure.

FIG. 5A is a flow diagram of an example method 500 to determine read levels based on a distribution voltage of a memory cell and read data using the determined read levels, in accordance with aspects of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device can receive a request to read data from a memory cell of a memory device coupled with a processing device. At operation 512, the processing device can determine a voltage distribution parameter value associated with the memory cell of the memory device. At operation 514, the processing device can determine a set of read levels associated with the voltage distribution parameter value, wherein each read level in the determined set of read levels corresponds to a respective voltage distribution of the memory cell. At operation 516, the processing device can read, using the determined set of read levels, data from the memory cell of the memory device.

Figure 5B:
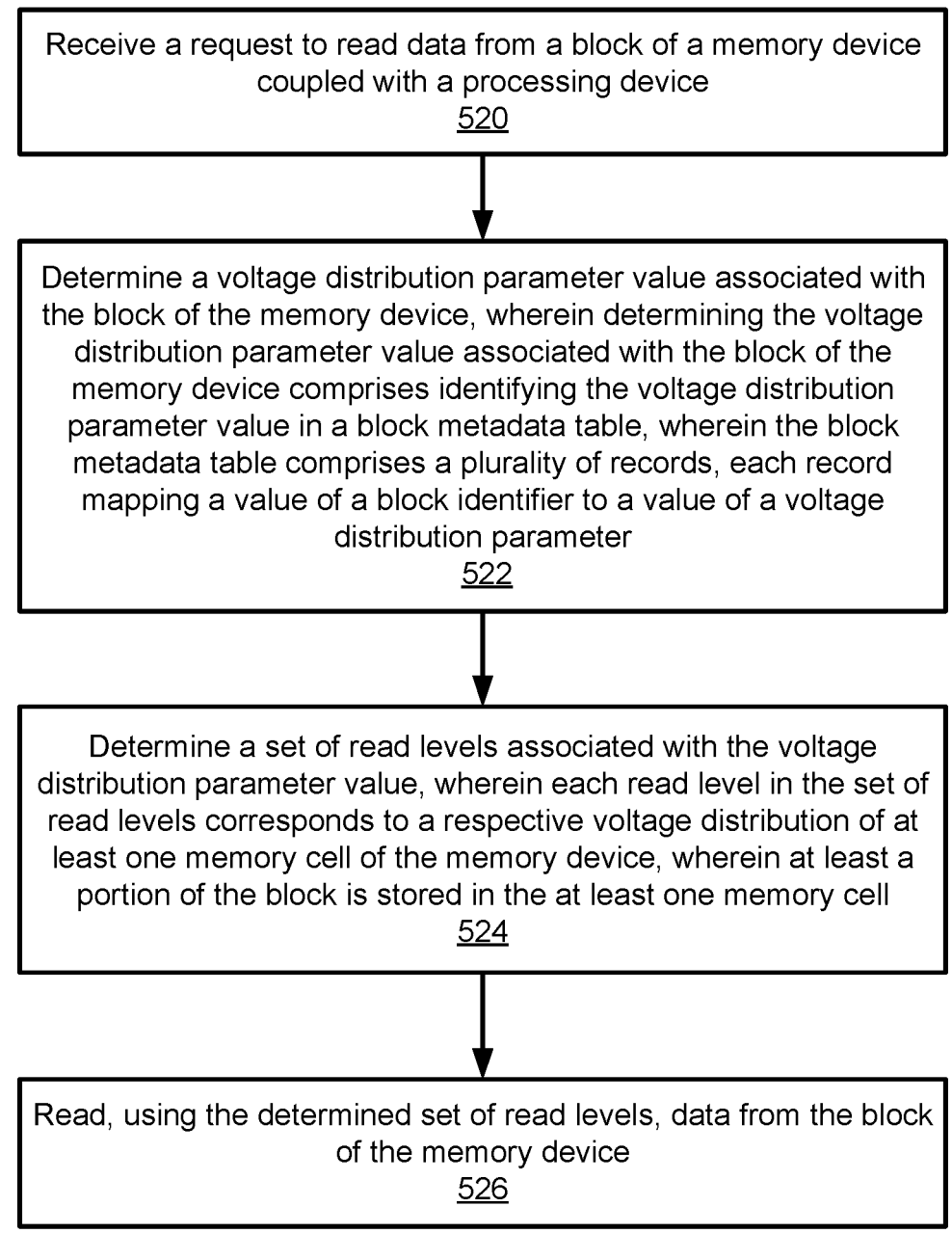
FIG. 5B is a flow diagram of an example method to determine read levels based on a distribution voltage of a block and read data using the determined read levels, in accordance with aspects of the present disclosure.

FIG. 5B is a flow diagram of an example method 501 to determine read levels based on a distribution voltage of a block and read data using the determined read levels, in accordance with aspects of the present disclosure. The method 501 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 501 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 520, the processing device can receive a request to read data from a block of a memory device coupled with a processing device. At operation 522, the processing device can determine a voltage distribution parameter value associated with the block of the memory device, wherein determining the voltage distribution parameter value associated with the block of the memory device comprises identifying the voltage distribution parameter value in a block metadata table, wherein the block metadata table comprises a plurality of records, each record mapping a value of a block identifier to a value of a voltage distribution parameter. At operation 524, the processing device can determine a set of read levels associated with the voltage distribution parameter value, wherein each read level in the set of read levels corresponds to a respective voltage distribution of at least one memory cell of the memory device, wherein at least a portion of the block is stored in the at least one memory cell. At operation 526, the processing device can read, using the determined set of read levels, data from the block of the memory device.

Figure 6:
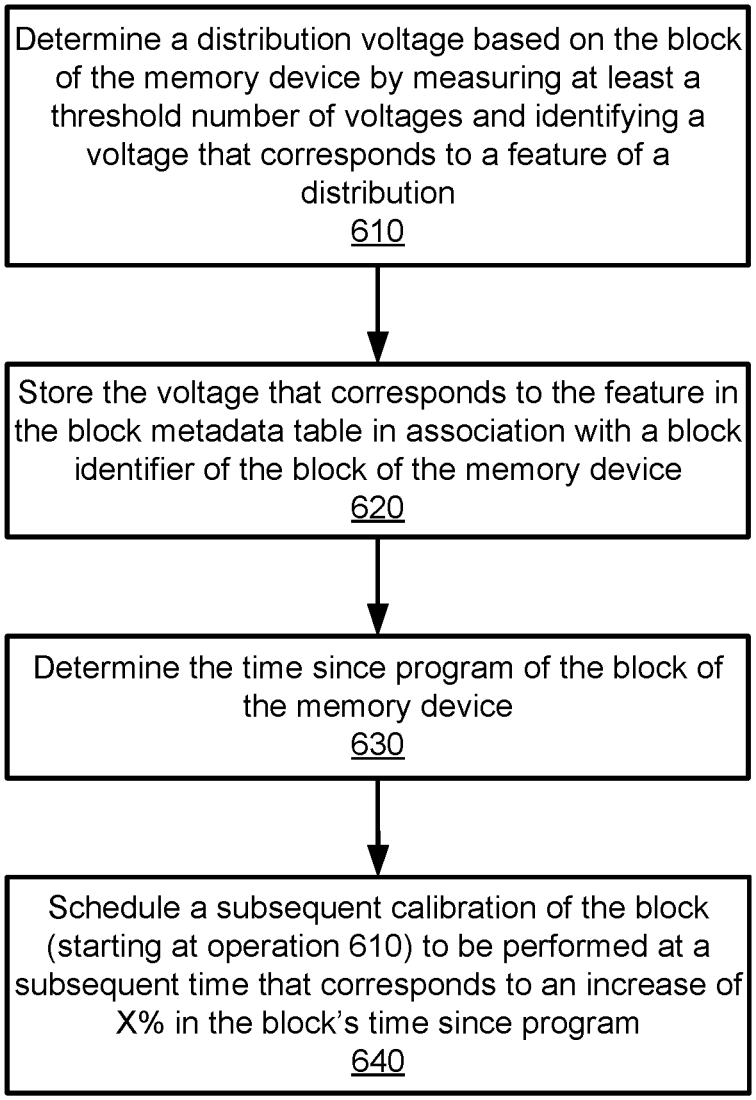
FIG. 6 is a flow diagram of an example method to perform a distribution voltage calibration scan that determines distribution voltages of blocks and stores the distribution voltages in a block metadata table, in accordance with aspects of the present disclosure.

FIG. 6 is a flow diagram of an example method 600 to perform a distribution voltage calibration scan that determines distribution voltages of blocks and stores the distribution voltages in a block metadata table, in accordance with aspects of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the read level manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing device can determine a distribution voltage based on the block of the memory device by measuring at least a threshold number of voltages and identifying a voltage that corresponds to a feature of the distribution. The feature of the distribution may be, for example, a peak of the distribution. The distribution voltage may be determined as a function or characteristic of the distribution, such as a mean, median, mode, or other characteristic of the distribution. At operation 620, the processing device can store the voltage that corresponds to the feature in the block metadata table in association with a block identifier of the block of the memory device.

At operation 630, the processing device can determine the time since program (TSP) of the block of the memory device. The determined time is referred to in the description of operation 640 below as a variable named "TSP" having associated time units. The time units may be, e.g., seconds. At operation 640, the processing device can schedule a subsequent calibration of the block (that is, a subsequent execution of method 600 starting at operation 610) to be performed at a subsequent time that corresponds to an increase of X % in the block's time since program relative to the current time. The current time can be, for example, the time at which operation 640 is executed. For example, the subsequent time can correspond to an increase of 50% in the block's time since program (TSP), in which case the subsequent time can be determined as the current time+ 0.50*TSP, or 0.50*TSP time units (e.g., seconds) in the future. The value X can be any desired numeric percentage.

Figure 7:
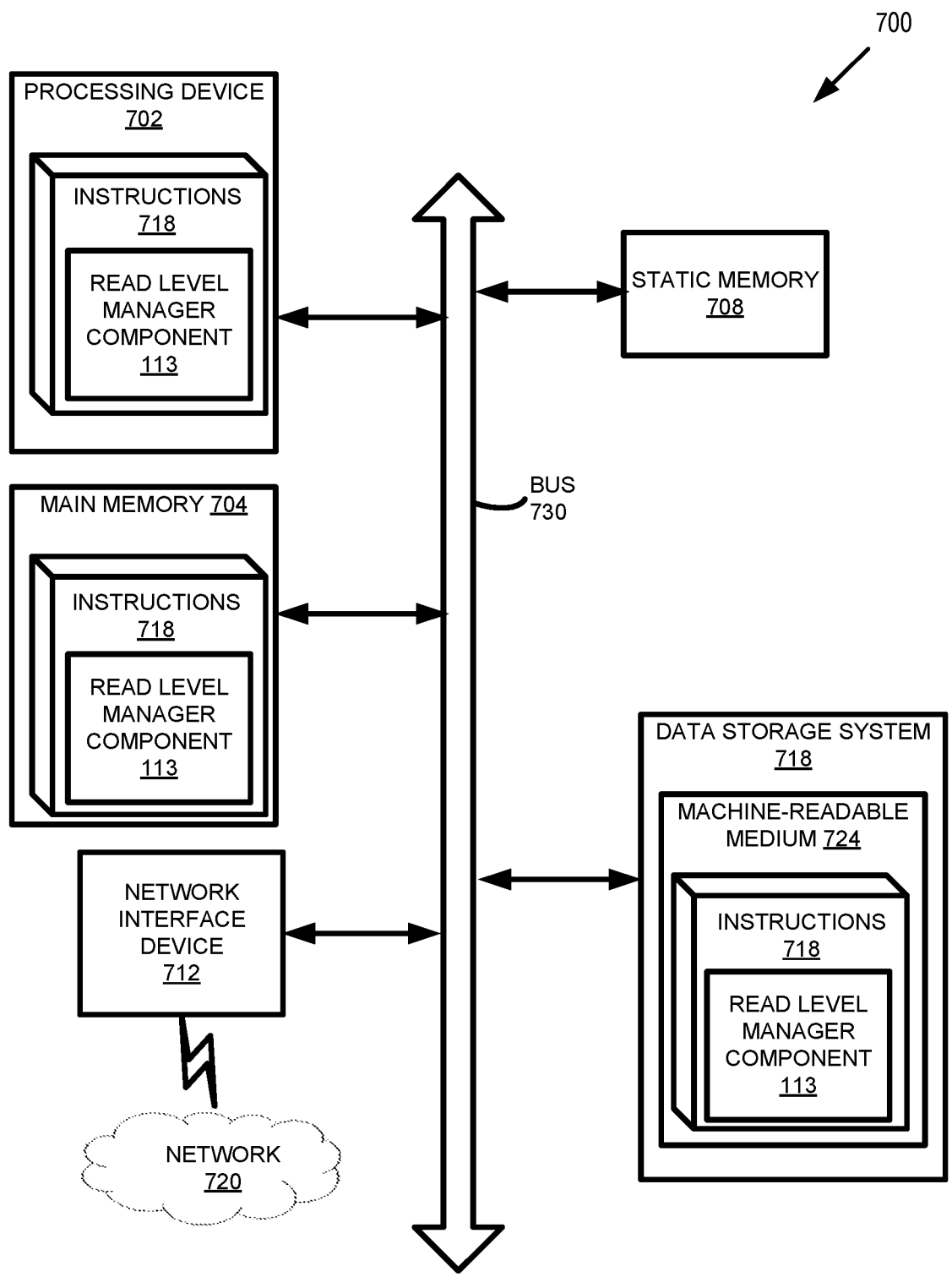
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read level manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a read level manager component (e.g., the read level manager component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    receiving, by a processing device, a request to read data from a memory cell of a memory device coupled with the processing device;
    determining a voltage distribution parameter value associated with the memory cell of the memory device;
    determining a set of read levels associated with the voltage distribution parameter value, wherein each read level in the determined set of read levels corresponds to a respective voltage distribution of the memory cell, wherein determining the set of read levels associated with the voltage distribution parameter value comprises:
        responsive to determining that a voltage mapping table does not include the voltage distribution parameter value, determining the set of read levels using interpolation based on first and second parameter values that are included in the voltage mapping table, wherein the set of read levels is determined as an average of a first set of read levels that correspond to the first parameter value and a second set of read levels that correspond to the second parameter value; and
    reading, using the determined set of read levels, data from the memory cell of the memory device.

2. The method of claim 1, wherein determining the voltage distribution parameter value associated with the memory cell of the memory device comprises:
    identifying a particular voltage distribution of the memory cell by sampling the memory cell at a plurality of voltage levels; and
    determining the voltage distribution parameter value based on the particular voltage distribution.

3. The method of claim 2, wherein the voltage distribution parameter value comprises a voltage value that is included in the particular voltage distribution of the memory cell.

4. The method of claim 2, wherein determining the voltage distribution parameter value comprises determining a median, mean, or mode of the particular voltage distribution.

5. The method of claim 1,
    wherein the voltage mapping table comprises a plurality of records, and each record maps a value of a voltage distribution parameter to a set of values of read levels.

6. The method of claim 1, wherein determining the set of read levels associated with the voltage distribution parameter value further comprises:
    responsive to determining that the voltage mapping table includes the voltage distribution parameter value, retrieving the determined set of read levels from the voltage mapping table, wherein the determined set of read levels are associated with the voltage distribution parameter value in the voltage mapping table.

7. The method of claim 1,
    wherein the voltage distribution parameter value is between the first and second parameter values,
    wherein the voltage mapping table maps the first parameter value to the first set of read levels in the voltage mapping table and further maps the second parameter value to the second set of read levels in the voltage mapping table.

8. The method of claim 1, wherein determining the set of read levels using interpolation comprises:
- identifying, in the voltage mapping table, the first parameter value, wherein the first parameter value is a maximum of one or more parameter values in the voltage mapping table that are less than the voltage distribution parameter value;
- determining a first weight based on a difference between the voltage distribution parameter value and the first parameter value;
- identifying, in the voltage mapping table, the second parameter value, wherein the second parameter value is a minimum of one or more parameter values in the voltage mapping table that are greater than the voltage distribution parameter value;
- determining a second weight based on a difference between the voltage distribution parameter value and the second parameter value; and
- determining the set of read levels based on a weighted average of the first set of read levels and the second set of read levels, wherein the first set of read levels are weighted by the first weight, and the second set of read values are weighted by the second weight.

9. The method of claim 1, wherein reading, using the determined set of read levels, data from the memory cell comprises:
- measuring a voltage of the memory cell; and
- identifying a logical level to which the measured voltage corresponds, wherein identifying the logical level comprises comparing the measured voltage to one or more of the read levels,
- wherein the data read from the memory cell comprises the identified logical level.

10. The method of claim 1, wherein the read levels comprise a plurality of read level offsets, and reading, using the determined set of read levels, data from the memory cell comprises:
- determining a plurality of adjusted read levels, wherein each adjusted read level is based on a sum of a base read level and a read level offset that corresponds to the base read level,
- wherein the data is read from the memory cell using the adjusted read levels.

11. A system comprising:
a memory; and
a processing device communicably coupled to the memory, the processing device to perform operations comprising:
- receiving a request to read data from a memory cell of a memory device coupled with the processing device;
- determining a voltage distribution parameter value associated with the memory cell of the memory device;
- determining a set of read levels associated with the voltage distribution parameter value, wherein each read level in the determined set of read levels corresponds to a respective voltage distribution of the memory cell, wherein determining the set of read levels associated with the voltage distribution parameter value comprises:
  - responsive to determining that a voltage mapping table does not include the voltage distribution parameter value, determining the set of read levels using interpolation based on first and second parameter values that are included in the voltage mapping table, wherein the set of read levels is determined as an average of a first set of read levels that correspond to the first parameter value and a second set of read levels that correspond to the second parameter value; and
- reading, using the determined set of read levels, data from the memory cell of the memory device.

12. The system of claim 11, wherein determining the voltage distribution parameter value associated with the memory cell of the memory device comprises:
- identifying a particular voltage distribution of the memory cell by sampling the memory cell at a plurality of voltage levels; and
- determining the voltage distribution parameter value based on the particular voltage distribution.

13. The system of claim 12, wherein the voltage distribution parameter value comprises a voltage value that is included in the particular voltage distribution of the memory cell.

14. The system of claim 12, wherein determining the voltage distribution parameter value comprises determining a median, mean, or mode of the particular voltage distribution.

15. The system of claim 11,
wherein the voltage mapping table comprises a plurality of records, and each record maps a value of a voltage distribution parameter to a set of values of read levels.

16. A non-transitory machine-readable storage medium storing instructions that cause a processing device to perform operations comprising:
- receiving a request to read data from a memory cell of a memory device coupled with the processing device;
- determining a voltage distribution parameter value associated with the memory cell of the memory device;
- determining a set of read levels associated with the voltage distribution parameter value, wherein each read level in the determined set of read levels corresponds to a respective voltage distribution of the memory cell, wherein determining the set of read levels associated with the voltage distribution parameter value comprises:
  - responsive to determining that a voltage mapping table does not include the voltage distribution parameter value, determining the set of read levels using interpolation based on first and second parameter values that are included in the voltage mapping table, wherein the set of read levels is determined as an average of a first set of read levels that correspond to the first parameter value and a second set of read levels that correspond to the second parameter value; and
- reading, using the determined set of read levels, data from the memory cell of the memory device.

17. The non-transitory machine-readable storage medium of claim 16, wherein determining the voltage distribution parameter value associated with the memory cell of the memory device comprises:
- identifying a particular voltage distribution of the memory cell by sampling the memory cell at a plurality of voltage levels; and
- determining the voltage distribution parameter value based on the particular voltage distribution.

18. The non-transitory machine-readable storage medium of claim 17, wherein the voltage distribution parameter value comprises a voltage value that is included in the particular voltage distribution of the memory cell.

19. The non-transitory machine-readable storage medium of claim 17, wherein determining the voltage distribution parameter value comprises determining a median, mean, or mode of the particular voltage distribution.

20. The non-transitory machine-readable storage medium of claim 16,
wherein the voltage mapping table comprises a plurality of records, and each record maps a value of a voltage distribution parameter to a set of values of read levels.

* * * * *